(12) United States Patent
Blodgett

(10) Patent No.: US 7,870,435 B2
(45) Date of Patent: *Jan. 11, 2011

(54) MEMORY DEVICE AND METHOD FOR REPAIRING A SEMICONDUCTOR MEMORY

(75) Inventor: Greg A. Blodgett, Nampa, ID (US)

(73) Assignee: Mosaid Technologies Incorporated (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/336,371

(22) Filed: Dec. 16, 2008

(65) Prior Publication Data

US 2009/0100291 A1    Apr. 16, 2009

Related U.S. Application Data

(63) Continuation of application No. 11/108,651, filed on Apr. 11, 2005, now Pat. No. 7,467,334, which is a continuation of application No. 10/375,994, filed on Feb. 27, 2003, now Pat. No. 6,892,318, which is a continuation of application No. 09/796,080, filed on Feb. 28, 2001, now Pat. No. 6,571,352, which is a continuation of application No. 09/143,283, filed on Aug. 28, 1998, now Pat. No. 6,199,177.

(51) Int. Cl.
*G06F 11/00* (2006.01)

(52) U.S. Cl. .................................................. 714/42

(58) Field of Classification Search ............... 714/2–8, 714/13, 15, 16, 30, 31, 42, 43, 48, 54
See application file for complete search history.

(56) References Cited

U.S. PATENT DOCUMENTS

| | | | |
|---|---|---|---|
| 4,459,685 A | 7/1984 | Sud et al. | |
| 4,473,895 A * | 9/1984 | Tatematsu | 365/200 |
| 4,601,019 A | 7/1986 | Shah et al. | |
| 5,179,536 A * | 1/1993 | Kasa et al. | 365/200 |
| 5,337,277 A * | 8/1994 | Jang | 365/200 |
| 5,381,370 A | 1/1995 | Lacey et al. | |
| 5,422,850 A | 6/1995 | Sukegawa et al. | |
| 5,452,251 A | 9/1995 | Akaogi et al. | |
| 5,513,144 A | 4/1996 | O'Toole | |
| 5,523,975 A | 6/1996 | Reddy | |
| 5,528,539 A | 6/1996 | Ong et al. | |
| 5,548,225 A | 8/1996 | Rountree et al. | |
| 5,576,633 A | 11/1996 | Rountree et al. | |
| 5,594,693 A | 1/1997 | Rouy et al. | |

(Continued)

*Primary Examiner*—Nadeem Iqbal
(74) *Attorney, Agent, or Firm*—Hamilton, Brook, Smith & Reynolds, P.C.

(57) ABSTRACT

A block repair device is used in a Dynamic Random Access Memory (DRAM) having a primary array with a defective cell and a redundant array with a redundant row. The block repair device stores a block repair configuration that determines the dimensions (e.g., the number of rows and columns spanned) of a repair block. Routing circuitry is configured by the stored block repair configuration to output some row and column address bits from received row and column addresses in a selected ratio. Comparison circuitry compares the row and column address bits output by the routing circuitry with the address of the defective cell that defines the repair block. When a match occurs, the comparison circuitry implements a block repair by activating the redundant row and by causing data to be written to or read from the activated redundant row instead of the primary array.

21 Claims, 7 Drawing Sheets

U.S. PATENT DOCUMENTS

| | | |
|---|---|---|
| 5,604,702 A | 2/1997 | Tailliet |
| 5,648,934 A | 7/1997 | O'Toole |
| 5,684,740 A | 11/1997 | Hirata |
| 5,703,817 A | 12/1997 | Shiratake et al. |
| 5,706,292 A | 1/1998 | Merritt |
| 5,729,551 A | 3/1998 | Park et al. |
| 5,751,647 A | 5/1998 | O'Toole |
| 5,835,425 A | 11/1998 | Berger |
| 5,867,504 A | 2/1999 | Pascucci |
| 5,914,907 A | 6/1999 | Kobayashi et al. |
| 6,006,313 A | 12/1999 | Fukumoto |
| 6,018,811 A | 1/2000 | Merritt |
| 6,038,682 A | 3/2000 | Norman |
| 6,044,029 A * | 3/2000 | Shore .................. 365/200 |
| 6,122,213 A * | 9/2000 | Shore .................. 365/222 |
| 6,154,851 A | 11/2000 | Sher et al. |
| 6,199,177 B1 * | 3/2001 | Blodgett .................. 714/7 |
| 6,282,670 B1 | 8/2001 | Islam et al. |
| 6,571,352 B2 | 5/2003 | Blodgett |
| 6,892,318 B2 * | 5/2005 | Blodgett .................. 714/7 |
| 6,910,152 B2 | 6/2005 | Blodgett |
| 7,467,334 B2 | 12/2008 | Blodgett |
| 2001/0016893 A1 | 8/2001 | Merritt |
| 2001/0044916 A1 | 11/2001 | Blodgett |
| 2002/0019961 A1 | 2/2002 | Blodgett |
| 2003/0154422 A1 | 8/2003 | Blodgett |
| 2004/0010737 A1 | 1/2004 | Merritt |

* cited by examiner

MEMORY DEVICE AND METHOD FOR REPAIRING A SEMICONDUCTOR MEMORY

CROSS-REFERENCE TO RELATED APPLICATIONS

This application is a continuation of application Ser. No. 11/108,651, filed Apr. 11, 2005, now U.S. Pat. No. 7,467,334, issuing Dec. 16, 2008, which is a continuation of application Ser. No. 10/375,994, filed Feb. 27, 2003, now U.S. Pat. No. 6,892,318, issued May 10, 2005, which is a continuation of application Ser. No. 09/796,080, filed Feb. 28, 2001, now U.S. Pat. No. 6,571,352, issued May 27, 2003, which is a continuation of application Ser. No. 09/143,283, filed Aug. 28, 1998, now U.S. Pat. No. 6,199,177, issued Mar. 6, 2001. The disclosure of each of the previously referenced U.S. patent applications and patents referenced is hereby incorporated by reference in its entirety.

BACKGROUND OF THE INVENTION

1. Technical Field

This invention relates in general to memory cell redundancy in semiconductor memories and, more particularly, to devices and methods for repairing semiconductor memories by replacing memory blocks that contain failing memory cells with redundant rows or columns of cells.

2. State of the Art

Semiconductor memories generally include a multitude of memory cells arranged in rows and columns. Each memory cell is capable of storing digital information in the form of a "1" or a "0" bit. To write (i.e., store) a bit into a memory cell, a binary memory address having portions identifying the cell's row (the "row address") and column (the "column address") is provided to addressing circuitry in the semiconductor memory to activate the cell, and the bit is then supplied to the cell. Similarly, to read (i.e., retrieve) a bit from a memory cell, the cell is again activated using the cell's memory address, and the bit is then output from the cell.

Semiconductor memories are typically tested after they are fabricated to determine if they contain any failing memory cells (i.e., cells to which bits cannot be dependably written or from which bits cannot be dependably read). Generally, when a semiconductor memory is found to contain failing memory cells, an attempt is made to repair the memory by replacing the failing memory cells with redundant memory cells provided in redundant rows or columns in the memory.

Conventionally, when a redundant row is used to repair a semiconductor memory containing a failing memory cell, the failing cell's row address is permanently stored (typically in pre-decoded form) on a chip on which the semiconductor memory is fabricated by programming a non-volatile element (e.g., a group of fuses, anti-fuses, or FLASH memory cells) on the chip. Then, during normal operation of the semiconductor memory, if the memory's addressing circuitry receives a memory address including a row address that corresponds to the row address stored on the chip, redundant circuitry in the memory causes a redundant memory cell in the redundant row to be accessed instead of the memory cell identified by the received memory address. Since every memory cell in the failing cell's row has the same row address, every cell in the failing cell's row, both operative and failing, is replaced by a redundant memory cell in the redundant row.

Similarly, when a redundant column is used to repair the semiconductor memory, the failing cell's column address is permanently stored (typically in pre-decoded form) on the chip by programming a non-volatile element on the chip. Then, during normal operation of the semiconductor memory, if the memory's addressing circuitry receives a memory address including a column address that corresponds to the column address stored on the chip, redundant circuitry in the memory causes a redundant memory cell in the redundant column to be accessed instead of the memory cell identified by the received memory address. Since every memory cell in the failing cell's column has the same column address, every cell in the failing cell's column, both operative and failing, is replaced by a redundant memory cell in the redundant column.

Thus, for example, as shown in FIG. 1, a semiconductor memory 20 having failing memory cells 22, 24, 26, 28, 30, 32, 34, and 36 is repaired in the conventional manner described above using redundant rows 38, 40, and 42 and redundant columns 44, 46, and 48. As described above, the memory 20 is repaired by replacing all memory cells in columns 50, 52, and 54, including failing memory cells 22, 24, 26, and 28, with redundant memory cells in redundant columns 44, 46, and 48. Further repairs to the memory 20 are accomplished by replacing all memory cells in rows 56, 58, and 60, including failing memory cells 30, 32, 34, and 36, with redundant memory cells in redundant rows 38, 40, and 42.

The process described above for repairing a semiconductor memory using redundant rows and columns is well known in the art, and is described in various forms in U.S. Pat. Nos. 4,459,685, 4,601,019, 5,422,850, and 5,528,539.

Unfortunately, it is difficult to provide enough redundant rows or columns in a semiconductor memory to repair all failing memory cells therein using the conventional repair process described above without using an excessive amount of space (commonly known as "real estate") in the memory for the redundant rows or columns. With the increasing size of semiconductor memories continuously increasing the need for redundancy, memory designers find themselves caught between providing sufficient redundancy to successfully repair most memories and, as a result, using excessive space in the memories, or providing insufficient redundancy to save space in the memories and, as a result, having to discard memories that are unrepairable. Obviously, neither alternative is desirable.

U.S. Pat. No. 5,548,225 to Rountree et al. discloses a repair system that, in contrast to the conventional repair system described above, does not use an entire redundant row or column to repair each defective memory cell in a semiconductor memory. In the Rountree repair system, the column address of a defective memory cell is stored using fuses in the same manner as described above. In addition, though, a partial row address common to a group of cells in the defective cell's column that includes the defective cell itself is also stored using fuses. When a memory address is received having column and row addresses that match the stored column address and stored partial row address, a redundant memory cell in a spare column is accessed. As a result, all of the cells in the group identified by the stored column address and stored partial row address are replaced by redundant cells in the spare column, while those cells in the defective cell's column not in the identified group are not replaced. Thus, the efficiency of repairs is increased by the Rountree system because only some of the redundant cells in the spare column are used to repair the defective cell, while other redundant cells remain in the spare column to repair other defective cells.

Unfortunately, the Rountree repair system can be problematic as well, because storing a full column address and a partial row address for every defective memory cell in need of repair requires a great deal of storage space (e.g., fuses, etc.). Consequently, the ever-increasing size of modern semiconductor memories, and the corresponding increase in the number of defective memory cells typically found, makes the Rountree repair system increasingly prohibitive to use because of the amount of storage space it requires.

Therefore, there is a need in the art for an improved device and method for repairing a semiconductor memory containing a failing memory cell. Such a device and method should replace the failing cell with a redundant memory cell without replacing the failing cell's entire row or column with the redundant cell's entire row or column. The device should also replace multiple failing cells in different rows or columns with redundant memory cells in a single redundant row or column in order to make more efficient use of redundant rows and columns, and should do so without the excessive need for storage space characteristic of the Rountree repair system.

BRIEF SUMMARY OF THE INVENTION

A block repair device in accordance with the present invention is used in a semiconductor memory, such as a Dynamic Random Access Memory (DRAM), having a primary array with a defective cell and a redundant array with a redundant row. The block repair device includes a set of non-volatile elements, such as fuses, anti-fuses, or flash EEPROM cells, that store a block repair configuration that determines the dimensions (e.g., the number of rows and columns spanned) of the repair block used to repair the defective cell. Routing circuitry, such as mux circuitry, in the block repair device is configured by the block repair configuration to output some received row and column address bits in a selected ratio. Comparison circuitry in the block repair device then compares the row and column address bits output by the routing circuitry with a stored portion of the address of the defective cell that defines the repair block. When a match occurs, the comparison circuitry implements a block repair by activating the redundant row and by causing data to be written to or read from the activated redundant row instead of the primary array.

The present invention thus provides an efficient device for implementing block repairs in a semiconductor memory. The device requires relatively few fuses or other non-volatile elements to implement a repair, in contrast to the Rountree and other conventional methods described above.

In other embodiments of the invention, the block repair device described above is incorporated into a semiconductor memory, a semiconductor substrate, such as a wafer, a DRAM, and an electronic system.

In a block repair method according to the present invention, a semiconductor memory having a primary array with a defective cell and a redundant array with a redundant row is repaired using a block repair. The dimensions of a repair block within the primary array for repairing the defective cell are first selected, and those row and column address bits of the defective cell that define the selected dimensions of the repair block are then stored using, for example, non-volatile elements within the semiconductor memory. A block repair configuration that corresponds to the selected dimensions of the repair block is also stored using, for example, non-volatile elements. Those received row and column address bits necessary to determine whether a received address falls within the repair block are then routed in accordance with the stored block repair configuration for comparison with the stored row and column address bits of the defective cell. When a match occurs, memory operations within the primary array are temporarily disabled, the redundant row is fired, and data is then written to or read from a cell within the redundant row selected in accordance with non-stored row and column address bits of the defective cell.

BRIEF DESCRIPTION OF THE SEVERAL VIEWS OF THE DRAWINGS

In the drawings, which illustrate what is currently regarded as the best mode for carrying out the invention and in which like reference numerals refer to like parts in different views or embodiments.

DETAILED DESCRIPTION OF THE INVENTION

Some general characteristics of the present invention will be described with respect to FIG. 2. This description will be followed by a detailed description of various embodiments of the present invention in connection with FIGS. 3-10.

Figure 1:
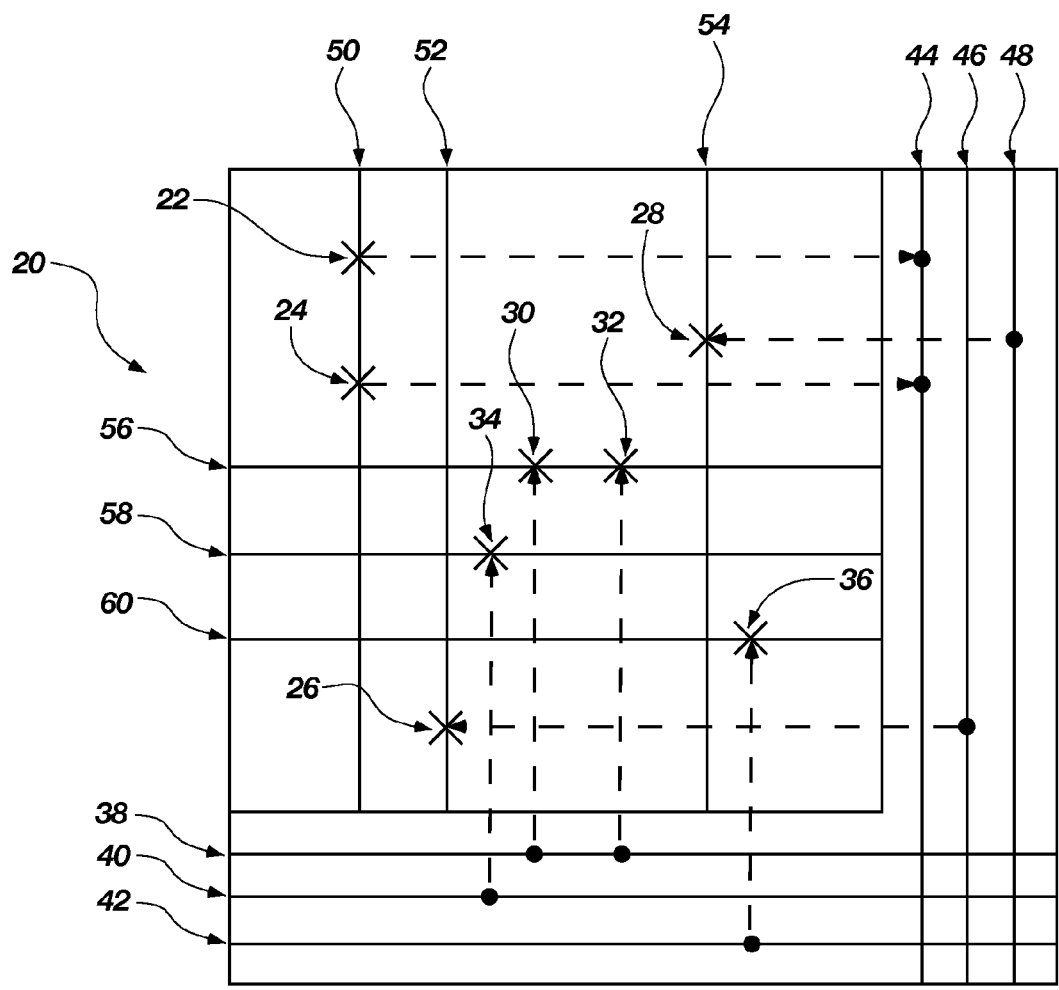
FIG. 1 is a prior art diagram illustrating conventional row and column redundancy in a semiconductor memory.
Figure 2:
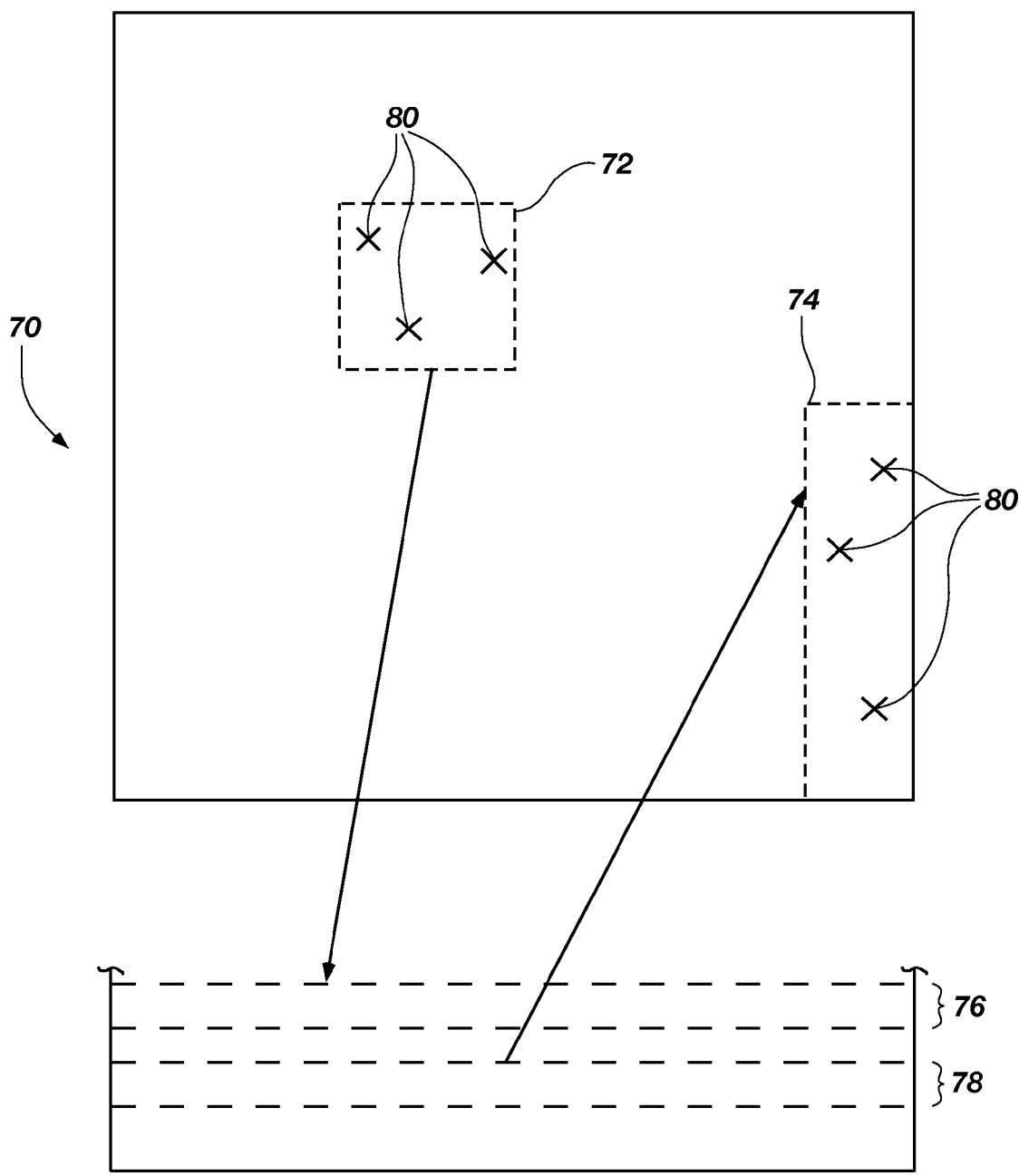
FIG. 2 is a diagram illustrating repair of a semiconductor memory in accordance with the present invention.

As shown in FIG. 2, a semiconductor memory 70 is repaired in accordance with the present invention by replacing memory blocks 72 and 74 with respective redundant rows 76 and 78. The position and dimensions (i.e., number of rows and columns spanned) of the memory blocks 72 and 74 are adjustable so an optimum number of defective memory cells 80 may be repaired using a minimum number of redundant rows. As a result, the present invention provides a highly efficient device and method for repairing a semiconductor memory. Also, the present invention provides such repair efficiency without the excessive need for fuses characteristic of the Rountree repair system previously discussed.

Figure 3:
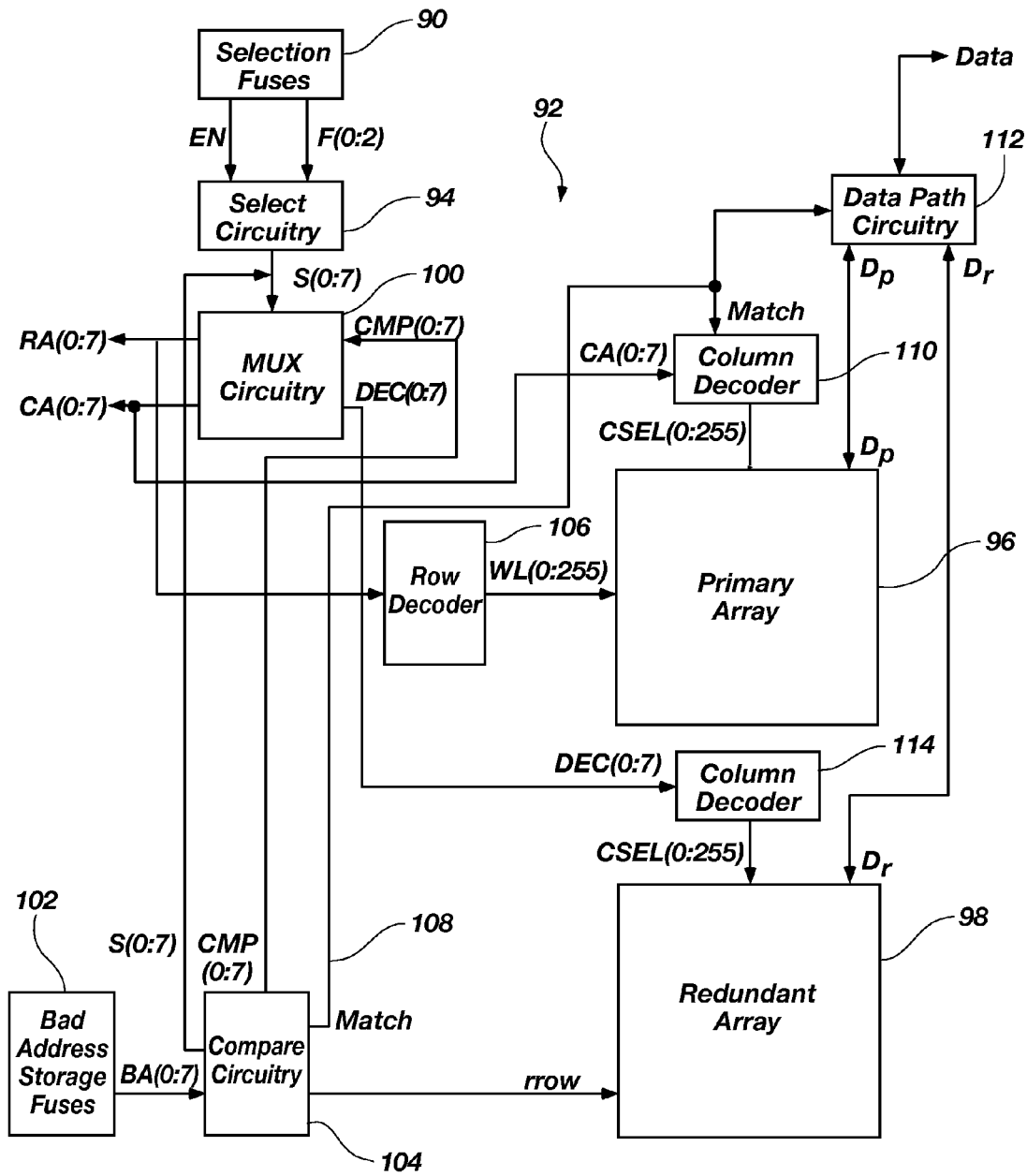
FIG. 3 is a block diagram showing a semiconductor memory in accordance with the present invention.

As shown in FIG. 3, selection fuses 90 in a 64 KB semiconductor memory 92 of the present invention may be programmed to output a block repair enable signal EN and fuse signals F(0:2) to select circuitry 94. When active, the block repair enable signal EN enables a block repair within a primary array 96 of the memory 92 using a selected redundant row within a redundant array 98 of the memory 92. When inactive, the block repair enable signal EN enables conventional row repair within the primary array 96 using the selected redundant row. When block repair is enabled within the primary array 96, the status of the fuse signals F(0:2) determines the dimensions of the repaired block. Together, the fuse signals F(0:2) and the block repair enable signal EN may sometimes be referred to as a "block repair configuration."

TABLE 1

| EN | F2 | F1 | F0 | S7 | S6 | S5 | S4 | S3 | S2 | S1 | S0 | S(0:7) |
|---|---|---|---|---|---|---|---|---|---|---|---|---|
| 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 1 | 1 |
| 1 | 0 | 0 | 1 | 0 | 0 | 0 | 0 | 0 | 0 | 1 | 1 | 3 |
| 1 | 0 | 1 | 0 | 0 | 0 | 0 | 0 | 0 | 1 | 1 | 1 | 7 |
| 1 | 0 | 1 | 1 | 0 | 0 | 0 | 0 | 1 | 1 | 1 | 1 | 15 |
| 1 | 1 | 0 | 0 | 0 | 0 | 0 | 1 | 1 | 1 | 1 | 1 | 31 |
| 1 | 1 | 0 | 1 | 0 | 0 | 1 | 1 | 1 | 1 | 1 | 1 | 63 |
| 1 | 1 | 1 | 0 | 0 | 1 | 1 | 1 | 1 | 1 | 1 | 1 | 127 |
| 1 | 1 | 1 | 1 | 1 | 1 | 1 | 1 | 1 | 1 | 1 | 1 | 255 |

Of course, it should be understood that although only one set of selection signals S(0:7) is discussed here, in fact, each redundant row within the redundant array 98 typically has an associated set of selection signals S(0:7).

In response to the selection signals S(0:7), and upon receiving row address signals RA(0:7) during a memory operation, mux circuitry 100 outputs compare signals CMP(0:7) as follows:

TABLE 2

| S(0:7) | CMP7 | CMP6 | CMP5 | CMP4 | CMP3 | CMP2 | CMP1 | CMP0 |
|---|---|---|---|---|---|---|---|---|
| 0 | RA7 | RA6 | RA5 | RA4 | RA3 | RA2 | RA1 | RA0 |
| 1 | RA7 | RA6 | RA5 | RA4 | RA3 | RA2 | RA1 | φ |
| 3 | RA7 | RA6 | RA5 | RA4 | RA3 | RA2 | φ | φ |
| 7 | RA7 | RA6 | RA5 | RA4 | RA3 | φ | φ | φ |
| 15 | RA7 | RA6 | RA5 | RA4 | φ | φ | φ | φ |
| 31 | RA7 | RA6 | RA5 | φ | φ | φ | φ | φ |
| 63 | RA7 | RA6 | φ | φ | φ | φ | φ | φ |
| 127 | RA7 | φ | φ | φ | φ | φ | φ | φ |
| 255 | φ | φ | φ | φ | φ | φ | φ | φ |

It should be understood that only one enable signal EN and only one set of fuse signals F(0:2) are shown in FIG. 3 for purposes of clarity. In fact, redundant rows (e.g., rrow$_0$, rrow$_1$, rrow$_2$, etc.) within the redundant array 98 typically each have their own enable signal (i.e., EN$_0$, EN$_1$, EN$_2$, etc.) and their own set of fuse signals (i.e., F$_0$(0:2), F$_1$(0:2), F$_2$(0:2), etc.) so that block repair or conventional repair can be selected for each redundant row using its enable signal, and so the dimensions of the repair block can be determined for each redundant row using its fuse signals if block repair is selected.

Although the present invention will be described with respect to a 64 KB memory, it should be understood that the invention is applicable to any size memory. It should also be understood that the invention is applicable to a wide variety of semiconductor memories, including, for example, Dynamic Random Access Memories (DRAMs) and Static RAMs (SRAMs). Further, it should be understood that any non-volatile element (e.g., fuses, anti-fuses, or flash EEPROM cells) will work for purposes of the selection fuses 90, as will be explained in more detail below with respect to FIGS. 4A, 4B, and 4C.

Upon receiving the enable signal EN and the fuse signals F(0:2), the select circuitry 94 outputs selection signals S(0:7) as follows:

Of course, each redundant row within the redundant array 98 typically has its own associated set of compare signals CMP(0:7).

The mux circuitry 100 thus passes the most significant bits of the row address RA(0:7) through in accordance with the selection signals S(0:7). As will be discussed below, this determines the "height" (i. e., the number of rows spanned) of a repair block. Thus, for example, with the selection signals S(0:7) all set to zero, the repair block has the height of a single row (because all bits of the row address RA(0:7) are passed through as compare signals CMP(0:7)). This only occurs when the repair block enable signal EN is inactive, so that conventional row repair is enabled. If, instead, the selection signals S(0:7) are set to fifteen, for example, then the repair block is sixteen rows high (because the four most significant bits of the row address RA(0:7) are passed through the mux circuitry 100). Finally, if the selection signals S(0:7) are set to two-hundred fifty-five, for example, then the repair block is two-hundred fifty-six rows high (i.e., the height of an entire column).

A portion of the address of a defective memory cell within the primary array 96 is stored using bad address storage fuses 102 and is output by the fuses 102 as bad address BA(0:7). If, for example, conventional row repair is being used to repair the defective memory cell, then the fuses 102 are programmed to output a bad address BA(0:7) equivalent to the row address of the defective cell. If, instead, a repair block sixteen rows high, for example, is being used to repair the defective cell, then the fuses 102 are programmed so the four most significant bits of the bad address (i.e., BA7, BA6, BA5, and BA4) match the four most significant bits of the row address of the defective cell, and so the four least significant bits of the bad address (i.e., BA3, BA2, BA1, and BA0) match the four most significant bits of the column address of the defective cell (for reasons that will be explained below). Finally, if the repair block used to repair the defective cell is an entire column within the primary array 96, then none of the fuses 102 are programmed with bits from the row address of the defective memory cell. Instead, the fuses 102 are programmed with the column address of the defective memory cell (again, for reasons that will be explained below).

Of course, it should be understood that each redundant row in the redundant array 98 typically has its own associated bad address BA(0:7). Only one is discussed here for purposes of clarity. Also, it should be understood that the fuses 102 may comprise any non-volatile element including, for example, fuses, anti-fuses, or flash EEPROM cells, as will be discussed below with respect to FIGS. 4A, 4B, and 4C.

Upon receiving the compare signals CMP(0:7), compare circuitry 104 compares any portion of the compare signals CMP(0:7) that includes bits of the row address RA(0:7) with any corresponding portion of the bad address BA(0:7) that contains bits of the row address of the defective memory cell. If a match occurs, the compare circuitry 104 fires a redundant row within the redundant array 98.

More specifically, the compare circuitry 104 masks out any portion of the compare signals CMP(0:7) and the bad address BA(0:7) that does not include a row address bit using the selection signals S(0:7) as the mask. The remaining portions of the compare signals CMP(0:7) and the bad address BA(0: 7) that do include row address bits are then compared, and the selected redundant row is fired when a match occurs. This process is summarized by the following logic equation:

rrow=CMP(0:7)•S*(0:7)⊙BA(0:7)•S*(0:7)    (1)

where a "*" indicates a logical complement, a "•" indicates a logical AND operation, and a "⊙" indicates a logical XAND operation (the complement of a logical XOR operation).

Thus, for example, if block repair is enabled and the repair block is sixteen rows high, then the masking and comparing operations are as follows in the case of a match:

10101101  CMP(0:7)
11110000  S*(0:7)
10100000  masked CMP(0:7)
10101101  BA(0:7)
11110000  S*(0:7)
10100000  masked BA(0:7)
10100000  masked CMP(0:7)
10100000  masked BA(0:7)
11111111  match, so fire rrow At the same time a redundant row (e.g., rrow) within the redundant array 98 is being fired as the result of a match within the compare circuitry 104, the received row address RA(0:7) is causing a row decoder 106 associated with the primary array 96 to fire a selected one of 256 primary rows WL(0:255). Thus, both a redundant row and a primary row are fired while the semiconductor memory 92 awaits a column address CA(0:7) to determine whether data will be written to or read from the primary array 96 or the redundant array 98.

Upon receiving the column address CA(0:7), the mux circuitry 100 updates the compare signals CMP(0:7) to include the column address CA(0:7) as follows:

TABLE 3

| S(0:7) | CMP7 | CMP6 | CMP5 | CMP4 | CMP3 | CMP2 | CMP1 | CMP0 |
|---|---|---|---|---|---|---|---|---|
| 0 | RA7 | RA6 | RA5 | RA4 | RA3 | RA2 | RA1 | RA0 |
| 1 | RA7 | RA6 | RA5 | RA4 | RA3 | RA2 | RA1 | CA7 |
| 3 | RA7 | RA6 | RA5 | RA4 | RA3 | RA2 | CA6 | CA7 |
| 7 | RA7 | RA6 | RA5 | RA4 | RA3 | CA5 | CA6 | CA7 |
| 15 | RA7 | RA6 | RA5 | RA4 | CA4 | CA5 | CA6 | CA7 |
| 31 | RA7 | RA6 | RA5 | CA3 | CA4 | CA5 | CA6 | CA7 |
| 63 | RA7 | RA6 | CA2 | CA3 | CA4 | CA5 | CA6 | CA7 |
| 127 | RA7 | CA1 | CA2 | CA3 | CA4 | CA5 | CA6 | CA7 |
| 255 | CA0 | CA1 | CA2 | CA3 | CA4 | CA5 | CA6 | CA7 |

Upon receiving the updated compare signals CMP(0:7), the compare circuitry 104 compares the updated compare signals CMP(0:7) to the bad address BA(0:7). When a match occurs, the compare circuitry 104 activates a match signal 108 that deactivates a column decoder 110 associated with the primary array 96 and directs data path circuitry 112 to input or output data $D_r$ from the redundant array 98. When a match does not occur, the column decoder 110 remains active and it selects data $D_p$ from the primary array 96 in accordance with the column address CA(0:7) for inputting or outputting through the data path circuitry 112. This process is summarized by the following logic equation:

match=CMP(0:7)⊙BA(0:7)    (2)

When data $D_r$ is written to or read from the redundant array 98, it is selected by a column decoder 114 in accordance with redundant decode signals DEC(0:7) that are output by the mux circuitry 100 as follows:

TABLE 4

| S(0:7) | DEC7 | DEC6 | DEC5 | DEC4 | DEC3 | DEC2 | DEC1 | DEC0 |
|---|---|---|---|---|---|---|---|---|
| 0 | CA0 | CA1 | CA2 | CA3 | CA4 | CA5 | CA6 | CA7 |
| 1 | CA0 | CA1 | CA2 | CA3 | CA4 | CA5 | CA6 | RA0 |
| 3 | CA0 | CA1 | CA2 | CA3 | CA4 | CA5 | RA1 | RA0 |
| 7 | CA0 | CA1 | CA2 | CA3 | CA4 | RA2 | RA1 | RA0 |
| 15 | CA0 | CA1 | CA2 | CA3 | RA3 | RA2 | RA1 | RA0 |
| 31 | CA0 | CA1 | CA2 | RA4 | RA3 | RA2 | RA1 | RA0 |
| 63 | CA0 | CA1 | RA5 | RA4 | RA3 | RA2 | RA1 | RA0 |
| 127 | CA0 | RA6 | RA5 | RA4 | RA3 | RA2 | RA1 | RA0 |
| 255 | RA7 | RA6 | RA5 | RA4 | RA3 | RA2 | RA1 | RA0 |

Of course, it will be understood that each redundant row within the redundant array 98 has its own associated set of redundant decode signals. Only one set is described here for purposes of clarity.

Figure 4A:
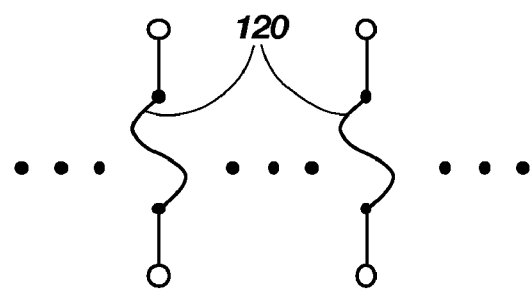
FIGS. 4A, 4B, and 4C are circuit schematics showing fuses, anti-fuses, and flash EEPROM cells capable of use as non-volatile elements in the semiconductor memory of FIG. 3.
Figure 4B:
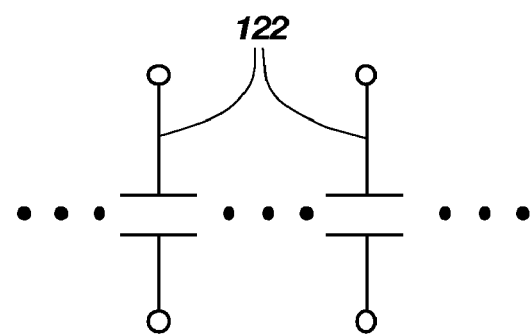
Figure 4C:
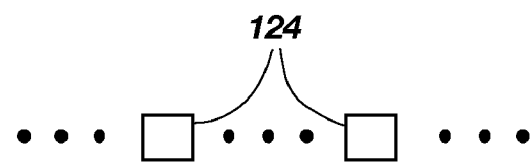

The selection fuses 90 and the bad address storage fuses 102 of FIG. 3 may comprise any non-volatile elements including, for example, fuses 120 as shown in FIG. 4A, anti-fuses 122 as shown in FIG. 4B, and flash EEPROM cells 124 as shown in FIG. 4C.

Figure 5:
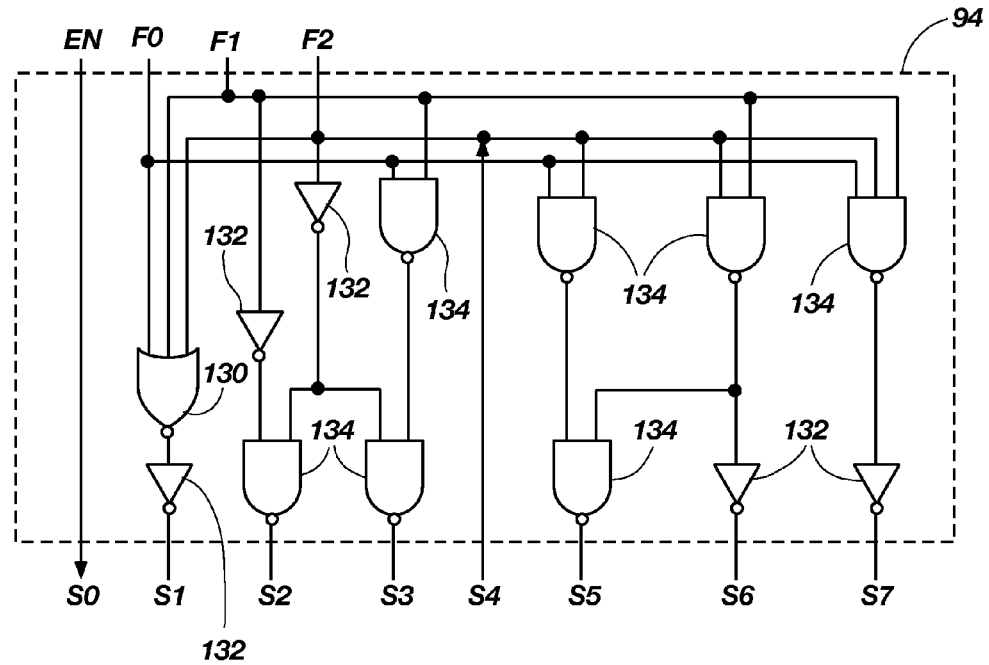
FIG. 5 is a circuit schematic showing select circuitry of the semiconductor memory of FIG. 3 in more detail.

As shown in FIG. 5, the select circuitry 94 of FIG. 3 includes a NOR gate 130, inverters 132, and NAND gates 134 for implementing the operations of the select circuitry 94 as described above with respect to Table 1. Of course, it should be understood that any device for selecting the height and width of a repair block will work for purposes of the present invention, and that such a device need not necessarily include the circuitry shown in FIG. 5 or operate in accordance with Table 1.

Figure 6:
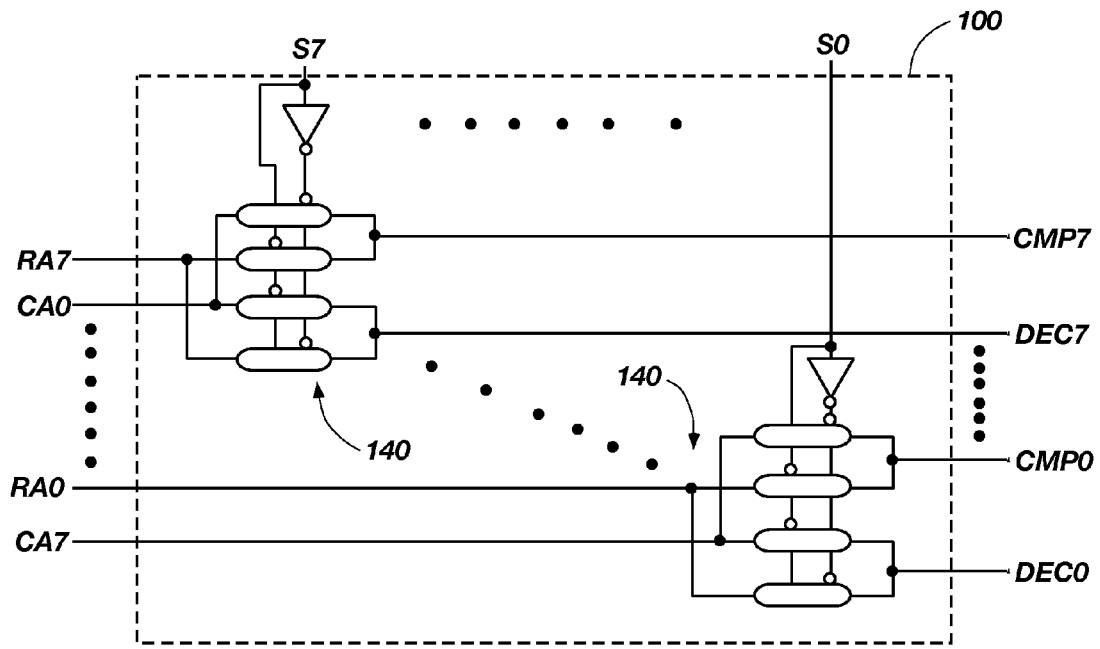
FIG. 6 is a circuit schematic showing mux circuitry of the semiconductor memory of FIG. 3 in more detail.

As shown in FIG. 6, the mux circuitry 100 includes a plurality of mux circuits 140 for implementing the operations of the mux circuitry 100 as described above with respect to Tables 2, 3, and 4. Again, it should be understood that any device for routing the proper row and column addresses to the compare circuitry 104 (see FIG. 3) will work for purposes of the present invention, and that such a device need not necessarily operate in accordance with Tables 2, 3, and 4.

Figure 7:
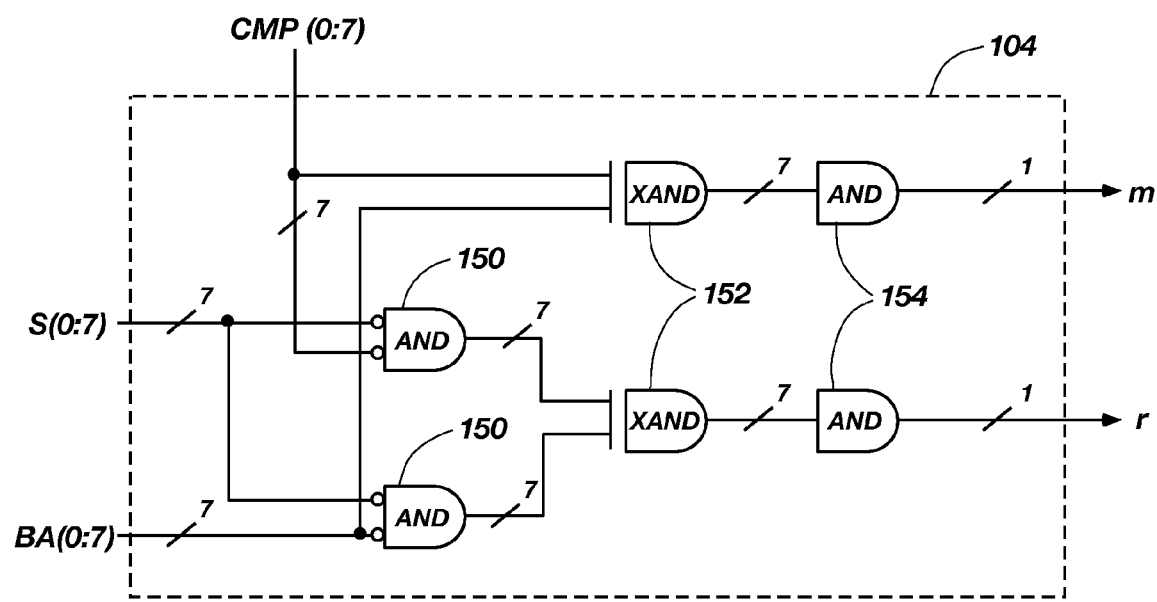
FIG. 7 is a circuit schematic showing compare circuitry of the semiconductor memory of FIG. 3 in more detail.

As shown in FIG. 7, the compare circuitry 104 includes logic low input AND gates 150, XAND gates 152 (each comprising, e.g., an XOR gate in series with an inverter), and AND gates 154 for implementing the operations of the compare circuitry 104 as described above with respect to equations (1) and (2). It should be understood that the gates 150, 152, and 154 are representative only, and that an actual implementation of the compare circuitry 104 would likely include multiple gates for performing the operations of the compare circuitry 104. For example, the logic low input AND gates 150 are shown in FIG. 7 as receiving fourteen inputs each and outputting seven outputs each. In reality, each of the AND gates 150 is typically implemented using seven low input AND gates, with each such gate receiving two inputs and outputting one output. Further, it should be understood that any device for comparing the compare signals CMP(0:7) to the bad address BA(0:7) will work for purposes of the present invention, and that such a device need not necessarily work using the masking and comparing operations described above with respect to FIG. 3.

It should be noted that, as described thus far, the present invention only uses repair blocks that stay within "logical" boundaries of the primary array 96 of FIG. 3. In addition, a repair block that spans one quarter of the rows in the top half of the primary array 96, for example, and one quarter of the rows in the bottom half of the primary array 96 can be implemented using an alternative embodiment described below.

In this alternative embodiment, repair blocks that cross logical boundaries within the primary array 96 of FIG. 3 may be used. For example, a repair block that spans an odd number of rows in the top half of the primary array 96 and an even number of rows in the bottom half of the primary array 96 can be implemented using this alternative embodiment. Such an embodiment typically requires that additional bad address storage fuses 102 (see FIG. 3) be provided to store additional bits from the row and column addresses of a defective memory cell. These additional bits are typically necessary to identify a match when row and column addresses are received. Such an embodiment also typically requires that the compare circuitry 104 (see FIG. 3) be constructed to perform the necessary logical operations to determine a match. This embodiment thus requires additional fuses or other non-volatile elements, but provides greater flexibility in selecting the optimum location of repair blocks.

In the specific example described, the row address Most Significant Bit (MSB) may be replaced with an XOR function of the MSB and the next lower row address term for the repair address match. Likewise, logical combinations of column address terms may be used in place of single column address terms to "shift" or split the repair block in the column dimension. For example, replacing the column MSB with an XAND function of the two most significant column address bits will split the repair block and match upper and lower quarters of the column address space rather than upper or lower halfs.

Figure 8:
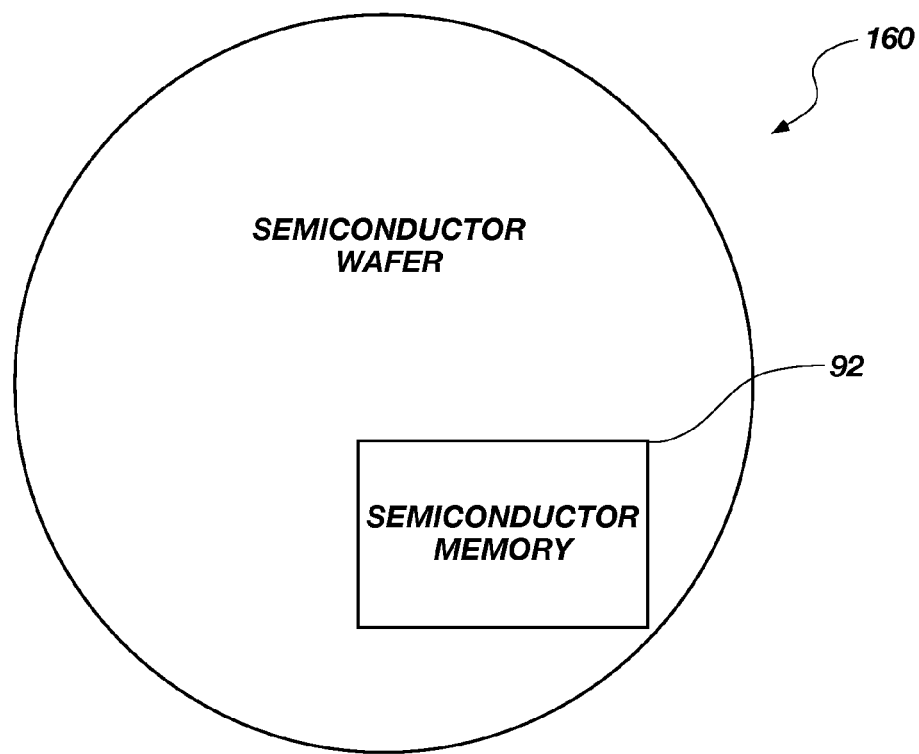
FIG. 8 is a diagram illustrating a semiconductor wafer on which the semiconductor memory of FIG. 3 is fabricated.

As shown in FIG. 8, the semiconductor memory 92 of FIG. 3 is fabricated on a semiconductor wafer 160. It should be understood that the memory 92 may also be fabricated on a wide variety of other semiconductor substrates including, for example, a Silicon-On-Insulator (SOI) substrate, a Silicon-On-Glass (SOG) substrate, and a Silicon-On-Sapphire (SOS) substrate.

Figure 9:
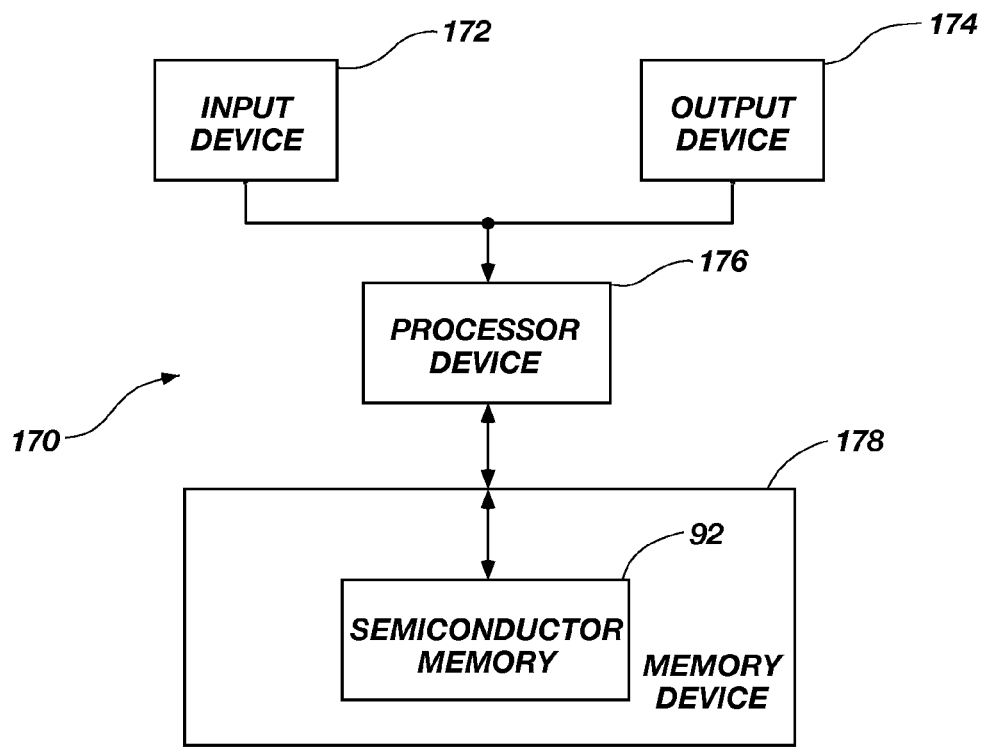
FIG. 9 is a block diagram of an electronic system incorporating the semiconductor memory of FIG. 3.

As shown in FIG. 9, an electronic system 170 includes an input device 172, an output device 174, a processor device 176, and a memory device 178 that incorporates the semiconductor memory 92 of FIG. 3. Of course, it should be understood that the semiconductor memory 92 may also be incorporated into any one of the input, output, and processor devices 172, 174, and 176.

Although the present invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A repairable memory device, comprising:
a primary array with at least one defective cell;
a redundant array with at least one redundant row for storing data addressed to the at least one defective cell of the primary array; and
repair circuitry including a stored location of the at least one defective cell, stored dimensions of a repair block logically spanning the stored location of the at least one defective cell and a comparison circuit to evaluate a received address and to select the at least one redundant row of the redundant array when the received address corresponds with the at least one defective cell of the primary array, the stored dimensions specifying a number of rows and a number of columns of the repair block, the number of rows and the number of columns each being an integer number greater than zero.

2. The repairable memory device of claim 1, wherein the comparison circuit is configured to compare a portion of the stored location of the at least one defective cell with a portion of the received address, the portions determined by the stored dimension of the repair block.

3. The repairable memory device of claim 1, wherein the comparison circuit is configured to compare a row address of the stored location of the at least one defective cell with a row address of the received address.

4. A repairable memory device, comprising:
a primary array with at least one defective cell included within a defined repair block;
a redundant array with at least one redundant row for storing data addressed to the at least one defective cell of the primary array; and
repair circuitry configurable to transform addresses of the at least one defective cell within the defined repair block into a linear arrangement for storing within the at least one redundant row of the redundant array when a received address is logically included within the defined repair block, the repair circuitry storing dimensions specifying a number of rows and a number of columns of the defined repair block, the number of rows and the number of columns each being an integer number greater than zero.

5. The repairable memory device of claim 4, wherein the defined repair block remains within a logical boundary of the primary array.

6. A method for repairing a memory device, comprising:
storing, in a non-volatile manner, dimensions of a repair block encompassing at least one defective memory cell in a primary array for comparison with a received address during a memory read operation; and
storing, in a non-volatile manner, a block repair configuration including at least one redundant row that corresponds to the stored dimensions of the repair block, the stored dimensions specifying a number of rows and a number of columns of the repair block, the number of rows and the number of columns each being an integer number greater than zero.

7. The method of claim 6, wherein non-volatilely storing the dimensions and the block repair configuration comprise storing using non-volatile elements selected from a group comprising fuses, anti-fuses, and flash EEPROM cells.

8. The method of claim 6, further comprising, when a comparison match occurs, disabling memory operations within the primary array by disabling a column decoder associated with the primary array.

9. The method of claim 6, further comprising writing data to or reading data from a cell within the redundant row by writing data to or reading data from a cell selected by a column decoder associated with the redundant row.

10. The method of claim 6, wherein storing a block repair configuration includes programming a non-volatile element to enable block repair with respect to the redundant row.

11. The method of claim 6, wherein storing a block repair configuration includes programming a non-volatile element to disable block repair with respect to the redundant row and thereby enable conventional row repair using the redundant row.

12. The method of claim 11, further comprising storing row and column address bits of a defective cell that define the stored dimensions of the repair block, the storing comprising storing only row address bits of the defective cell.

13. The repairable memory device of claim 1, wherein the repair circuitry further comprises select circuitry configured to output selection signals to select the number of rows of the repair block based on a block repair configuration.

14. The repairable memory device of claim 13, wherein the repair circuitry further comprises selection fuses configured to indicate the block repair configuration, the block repair configuration including a repair enable signal and fuse signals corresponding to the stored dimensions.

15. The repairable memory device of claim 14, wherein the number of selection signals is $2^n$, where n is the number of fuse signals.

16. The repairable memory device of claim 13, wherein the repair circuitry further comprises multiplexer circuitry configured to output compare signals based on the selection signals and row address signals corresponding to the received address.

17. The repairable memory device of claim 16, wherein, in accordance with the selection signals, the multiplexer circuitry passes certain most significant bits defined by the row address signals.

18. The repairable memory device of claim 15, wherein the repair circuitry further comprises compare circuitry configured to compare the compare signals against the stored location of the at least one defective cell, the compare circuitry controlling the redundant array to output data signals based on the comparison.

19. The repairable memory device of claim 1, wherein the repair circuitry further comprises bad address storage fuses capable of storing a portion of an address of the at least one defective cell.

20. The repairable memory device of claim 1, wherein the primary array is a DRAM array.

21. The repairable memory device of claim 1, wherein the repairable device is configured to communicate with a separate processor device.

* * * * *